US012620802B2

(12) United States Patent
Chen et al.

(10) Patent No.: US 12,620,802 B2
(45) Date of Patent: May 5, 2026

(54) SEMICONDUCTOR DEVICE STRUCTURE AND METHOD OF MANUFACTURING THE SAME

(71) Applicant: INNOSCIENCE (SUZHOU) SEMICONDUCTOR CO., LTD., Jiangsu (CN)

(72) Inventors: Chang Chen, Guangdong (CN); Xiaoming Liu, Guangdong (CN); Xinyu Li, Guangdong (CN)

(73) Assignee: INNOSCIENCE (SUZHOU) SEMICONDUCTOR CO., LTD., Jiangsu (CN)

( * ) Notice: Subject to any disclaimer, the term of this patent is extended or adjusted under 35 U.S.C. 154(b) by 248 days.

(21) Appl. No.: 18/573,406

(22) PCT Filed: Nov. 15, 2022

(86) PCT No.: PCT/CN2022/131892
§ 371 (c)(1),
(2) Date: Dec. 21, 2023

(87) PCT Pub. No.: WO2024/103247
PCT Pub. Date: May 23, 2024

(65) Prior Publication Data
US 2025/0096558 A1 Mar. 20, 2025

(51) Int. Cl.
*H02H 9/04* (2006.01)
*H10D 30/47* (2025.01)
(Continued)

(52) U.S. Cl.
CPC .......... *H02H 9/046* (2013.01); *H10D 30/475* (2025.01); *H10D 84/0123* (2025.01);
(Continued)

(58) Field of Classification Search
CPC .. H02H 9/046; H10D 30/475; H10D 84/0123; H10D 84/813; H10D 62/343;
(Continued)

(56) References Cited

U.S. PATENT DOCUMENTS 7,863,877 B2 * 1/2011 Briere ................ H10D 30/4755
323/224
9,799,643 B2 10/2017 Vielemeyer et al.
(Continued)

FOREIGN PATENT DOCUMENTS

CN 104183637 12/2014

OTHER PUBLICATIONS

"International Search Report (Form PCT/ISA/210) of PCT/CN2022/131892", mailed on Jul. 24, 2023, pp. 1-3.
(Continued)

*Primary Examiner* — Thienvu V Tran
*Assistant Examiner* — Muaamar Qahtan Al-Taweel

(57) ABSTRACT

Semiconductor device structures and methods for manufacturing the same are provided. The semiconductor device structure includes a substrate, a first nitride semiconductor layer, a second nitride semiconductor layer, a first transistor and a clamping device. The first nitride semiconductor layer is disposed on the substrate. The second nitride semiconductor layer is disposed on the first nitride semiconductor layer. The first transistor is disposed on the second nitride semiconductor layer. The first transistor includes a first control electrode, a first current electrode and a second current electrode. The clamping device is disposed on the second nitride semiconductor layer and electrically coupled with the first transistor. The clamping device includes a second transistor and a third transistor electrically coupled with the second transistor. The clamping device is electri-
(Continued)

cally coupled with the first current electrode and the second current electrode of the first transistor.

23 Claims, 12 Drawing Sheets

(51) Int. Cl.

| | |
|---|---|
| *H10D 62/17* | (2025.01) |
| *H10D 62/85* | (2025.01) |
| *H10D 84/01* | (2026.01) |
| *H10D 84/80* | (2025.01) |

(52) U.S. Cl.
CPC ......... *H10D 84/813* (2025.01); *H10D 62/343* (2025.01); *H10D 62/8503* (2025.01)

(58) Field of Classification Search
CPC .... H10D 62/8503; H10D 30/47; H10D 84/82; H10D 84/01; H10D 84/05
See application file for complete search history.

(56) References Cited

U.S. PATENT DOCUMENTS

| | | | | |
|---|---|---|---|---|
| 10,438,945 | B2 | 10/2019 | Vielemeyer et al. | |
| 2010/0148727 | A1* | 6/2010 | Kwong ................... | H02J 7/663 |
| | | | | 320/134 |
| 2012/0248565 | A1* | 10/2012 | Tasaka ................... | H03K 17/74 |
| | | | | 257/472 |
| 2014/0002049 | A1* | 1/2014 | Schrom .............. | H02M 3/1588 |
| | | | | 323/311 |
| 2014/0092508 | A1 | 4/2014 | Ko et al. | |
| 2014/0346569 | A1 | 11/2014 | Vielemeyer et al. | |
| 2018/0047719 | A1 | 2/2018 | Vielemeyer et al. | |
| 2020/0350875 | A1* | 11/2020 | Parthasarathy .... | H10D 30/4732 |
| 2021/0249855 | A1* | 8/2021 | Whitney .......... | H03K 19/00315 |

OTHER PUBLICATIONS

"Written Opinion of the International Searching Authority (Form PCT/ISA/237) of PCT/CN2022/131892", mailed on Jul. 24, 2023, pp. 1-3.

\* cited by examiner

1

SEMICONDUCTOR DEVICE STRUCTURE AND METHOD OF MANUFACTURING THE SAME

CROSS-REFERENCE TO RELATED APPLICATION

This application is a 371 of international application of PCT application serial no. PCT/CN2022/131892, filed on Nov. 15, 2022. The entirety of the above mentioned patent application is hereby incorporated by reference herein and made a part of this specification.

BACKGROUND

1. Field of the Disclosure

The present disclosure relates to a semiconductor device structure and more particularly to a semiconductor device structure including a clamping device.

2. Description of Related Art

Components including direct bandgap semiconductors, such as semiconductor components including group III-V materials or group III-V compounds (Category: III-V compounds) can operate or work under a variety of conditions or in a variety of environments (e.g., at different voltages and frequencies).

The semiconductor components may include a hetero-junction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a first transistor and a clamping device. The first nitride semiconductor layer is disposed on the substrate. The second nitride semiconductor layer is disposed on the first nitride semiconductor layer. The first transistor is disposed on the second nitride semiconductor layer. The first transistor includes a first control electrode, a first current electrode and a second current electrode. The clamping device is disposed on the second nitride semiconductor layer and electrically coupled with the first transistor. The clamping device includes a second transistor and a third transistor electrically coupled with the second transistor. The clamping device is electrically coupled with the first current electrode and the second current electrode of the first transistor.

According to some embodiments of the present disclosure, a method of manufacturing a semiconductor device structure includes: providing a substrate; forming a first nitride semiconductor layer on the substrate; forming a second nitride semiconductor layer on the first nitride semiconductor layer; forming a first transistor on the second nitride semiconductor layer, wherein the first transistor comprises a first control electrode, a first current electrode and a second current electrode; and forming a clamping device on the second nitride semiconductor layer. The clamping device includes a second transistor and a third transistor electrically coupled with the second transistor. The clamping device is electrically coupled with the first current electrode and the second current electrode of the first transistor.

2

According to some embodiments of the present disclosure, a semiconductor device structure includes a substrate, a first nitride semiconductor layer, a second nitride semiconductor layer, a first transistor and a clamping device. The first nitride semiconductor layer is disposed on the substrate. The second nitride semiconductor layer is disposed on the first nitride semiconductor layer. The first transistor is disposed on the second nitride semiconductor layer. The first transistor includes a first control electrode, a first current electrode and a second current electrode. The clamping device is disposed on the second nitride semiconductor layer. The clamping device includes a second transistor and a third transistor. The second transistor includes a second control electrode, a third current electrode, and a fourth current electrode. The third transistor includes a third control electrode and a fifth current electrode. The third current electrode of the second transistor is coupled with the third control electrode of the third transistor. A first potential midpoint is connected to the fifth current electrode of the third transistor and the first current electrode of the first transistor. A second potential midpoint is connected to the fourth current electrode of the second transistor and the second current electrode of the first transistor.

The present disclosure provides a semiconductor device structure including a clamping device. The clamping device may be coupled to a working device. The clamping device may include a first transistor and a second transistor electrically connected to the working device in parallel. When there is a short-circuit between a current electrode of the working device and ground, the potential difference between the switch electrode and the current electrode of the working device may be fixed.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
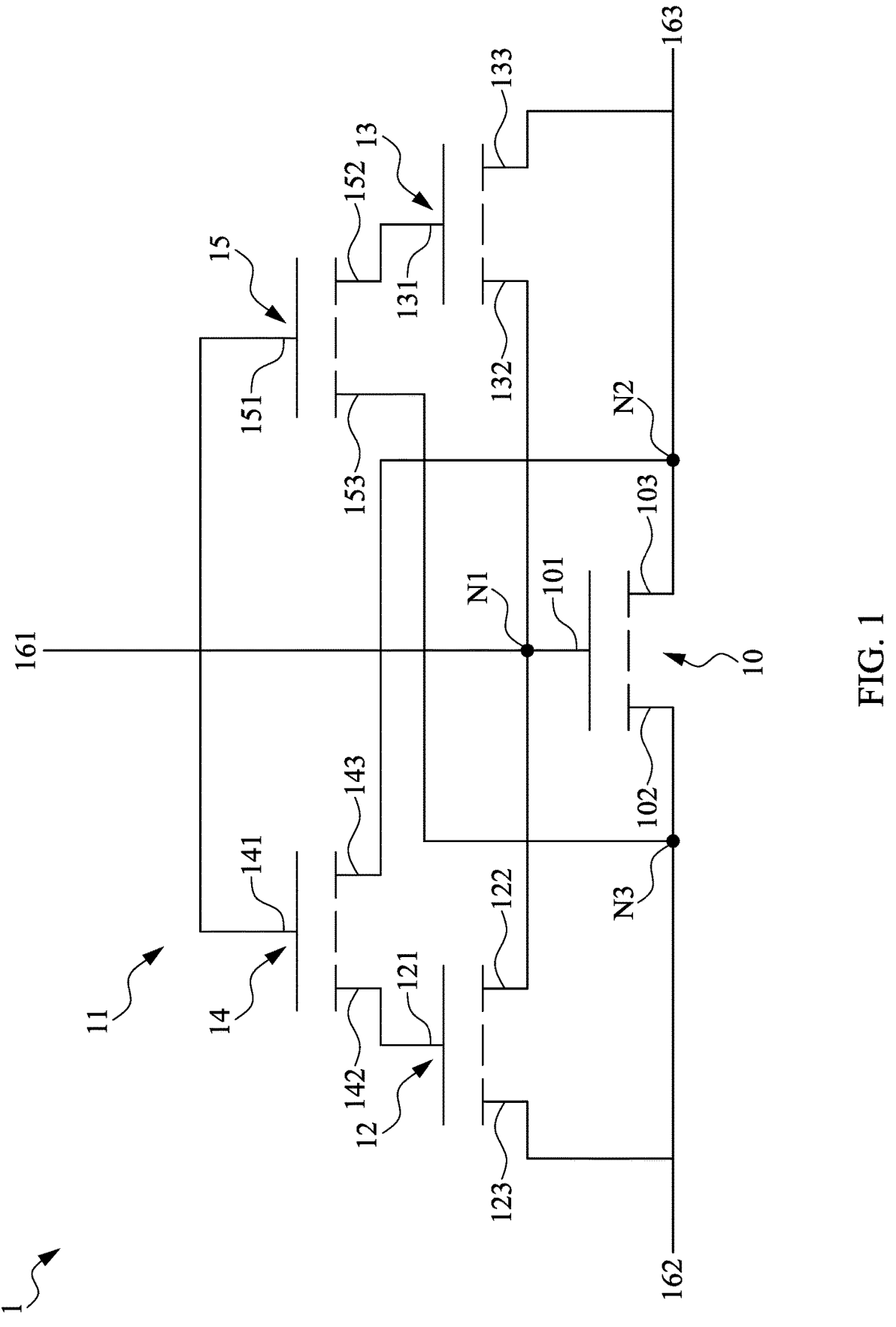
FIG. 1 is a schematic view of a circuit, in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure including a clamping device. The clamping device may be coupled to a working device. The clamping device may include a first transistor and a second transistor electrically connected to the working device in parallel. When there is a short-circuit between a current electrode of the working device and ground, the potential difference between the switch electrode and the current electrode of the working device may be fixed.

FIG. 1 is a schematic view of a circuit 1, in accordance with some embodiments of the present disclosure. The circuit 1 of the present disclosure can be applied to, without limitation, HEMT devices, in particular low voltage HEMT devices, high voltage HEMT devices or radio frequency (RF) HEMT devices.

The circuit 1 may include a device 10 and a device 11.

The device 10 may include a working device. The device 10 may include a transistor. The device 10 may be configured to transmit a data signal. The data signal may include an analog signal. The data signal may include a digital signal. The data signal may include a radio frequency (RF) signal. The device 10 may be configured to transmit a power signal. The device 10 may be an HEMT. The device 10 may be an HBT. The device 10 may be an HFET. The device 10 may be a MODFET.

The device 10 may include a terminal 101, a terminal 102, and a terminal 103.

The terminal 101 may correspond to a control electrode (e.g., a gate) of a semiconductor device structure. The terminal 101 may be electrically coupled to a terminal 161. The terminal 101 may be electrically coupled to the device 11. The terminal 161 may be coupled to a power source.

The terminal 102 may correspond to a current electrode (e.g., a source or a drain) of a semiconductor device structure. The terminal 102 may be electrically coupled to a terminal 162. The terminal 102 may be electrically coupled to the device 11. The terminal 162 may be coupled to an external device. The external device may include an active device. The external device may include a passive device. The active device may include a transistor. The active device may include a diode. The passive device may include a capacitor. The passive device may include a resistor. The passive device may include an inductor.

The terminal 103 may correspond to a current electrode (e.g., a source or a drain) of a semiconductor device structure. The terminal 103 may be electrically coupled to a terminal 163. The terminal 163 may be coupled to an external device. The terminal 163 may be coupled to a power source. The terminals 102 and 103 may correspond to a source and a drain of a semiconductor device structure, respectively. The terminals 102 and 103 may correspond to a drain and a source of a semiconductor device structure, respectively.

The device 11 may include a clamping device. The device 11 may be configured to fix a potential difference between the current electrode and the control electrode of the working device (e.g., the device 10). The device 11 may be electrically coupled to the device 10. The device 11 may include a transistor 12, a transistor 13, a transistor 14, and a transistor 15.

The transistor 12 may be an HEMT. The transistor 12 may be an HBT. The transistor 12 may be an HFET. The transistor 12 may be a MODFET. The transistor 12 may include a terminal 121, a terminal 122, and a terminal 123.

The terminal 121 may correspond to a control electrode (e.g., a gate) of a semiconductor device structure. The terminal 121 may be electrically connected to the transistor 14. The terminal 121 may be electrically connected to a current electrode of the transistor 14.

The terminal 122 may correspond to a current electrode (e.g., a source) of a semiconductor device structure. The terminal 122 may be electrically connected to the device 10. The terminal 122 may be electrically connected to the terminal 101 of the device 10. The terminal 122 may be electrically connected to the transistor 13. The terminal 122 may be electrically connected to a current electrode of the transistor 13.

The terminal 123 may correspond to a current electrode (e.g., a drain) of a semiconductor device structure. The terminal 123 may be electrically connected to the device 10. The terminal 123 may be electrically connected to the terminal 102 of the device 10. The terminal 123 may be electrically connected to the terminal 162.

The transistor 13 may be an HEMT. The transistor 13 may be an HBT. The transistor 13 may be an HFET. The transistor 13 may be a MODFET. The transistor 13 may include a terminal 131, a terminal 132, and a terminal 133.

The terminal 131 may correspond to a control electrode (e.g., a gate) of a semiconductor device structure. The terminal 131 may be electrically connected to the transistor 15. The terminal 131 may be electrically connected to a current electrode of the transistor 15.

The terminal 132 may correspond to a current electrode (e.g., a drain) of a semiconductor device structure. The terminal 132 may be electrically connected to the device 10. The terminal 132 may be electrically connected to the terminal 101 of the device 10. The terminal 132 may be electrically connected to the transistor 12. The terminal 132 may be electrically connected to the terminal 122 of the transistor 12.

The terminal 133 may correspond to a current electrode (e.g., a source) of a semiconductor device structure. The terminal 133 may be electrically connected to the device 10. The terminal 133 may be electrically connected to the terminal 103 of the device 10. The terminal 133 may be electrically connected to the terminal 163.

The transistor 14 may be an HEMT. The transistor 14 may be an HBT. The transistor 14 may be an HFET. The transistor 14 may be a MODFET. The transistor 14 may include a terminal 141, a terminal 142, and a terminal 143.

The terminal 141 may correspond to a control electrode (e.g., a gate) of a semiconductor device structure. The terminal 141 may be electrically connected to the terminal 161. The terminal 141 may be electrically connected to the transistor 15. The terminal 141 may be electrically connected to a control electrode of the transistor 15.

The terminal 142 may correspond to a current electrode (e.g., a source) of a semiconductor device structure. The terminal 142 may be electrically connected to the transistor 12. The terminal 142 may be electrically connected to the terminal 121 of the transistor 12.

The terminal 143 may correspond to a current electrode (e.g., a drain) of a semiconductor device structure. The terminal 143 may be electrically connected to the device 10. The terminal 143 may be electrically connected to the terminal 103 of the device 10. The terminal 143 may be electrically connected to the terminal 163.

The transistor 15 may be an HEMT. The transistor 15 may be an HBT. The transistor 15 may be an HFET. The transistor 15 may be a MODFET. The transistor 15 may include a terminal 151, a terminal 152, and a terminal 153.

The terminal 151 may correspond to a control electrode (e.g., a gate) of a semiconductor device structure. The terminal 151 may be electrically connected to the terminal 161. The terminal 151 may be electrically connected to the transistor 14. The terminal 151 may be electrically connected to the terminal 141 of the transistor 14.

The terminal 152 may correspond to a current electrode (e.g., a drain) of a semiconductor device structure. The terminal 152 may be electrically connected to the transistor 13. The terminal 152 may be electrically connected to the terminal 131 of the transistor 13.

The terminal 153 may correspond to a current electrode (e.g., a source) of a semiconductor device structure. The terminal 153 may be electrically connected to the device 10. The terminal 153 may be electrically connected to the terminal 102 of the device 10. The terminal 153 may be electrically connected to the terminal 162.

A potential midpoint N1 may be connected to the terminal 101 of the device 10. The potential midpoint N1 may be connected to the terminal 122 of the transistor 12. The potential midpoint N1 may be connected to the terminal 132 of the transistor 13. The potential midpoint N1 may be connected to the terminal 141 of the transistor 14. The potential midpoint N1 may be connected to the terminal 151 of the transistor 15. The potential midpoint N1 may be connected to the terminal 161.

A potential midpoint N2 may be connected to the terminal 103 of the device 10. The potential midpoint N2 may be connected to the terminal 133 of the transistor 13. The potential midpoint N2 may be connected to the terminal 143 of the transistor 14. The potential midpoint N2 may be connected to the terminal 163.

A potential midpoint N3 may be connected to the terminal 102 of the device 10. The potential midpoint N3 may be connected to the terminal 123 of the transistor 12. The potential midpoint N3 may be connected to the terminal 153 of the transistor 15. The potential midpoint N3 may be connected to the terminal 162.

Figure 2:
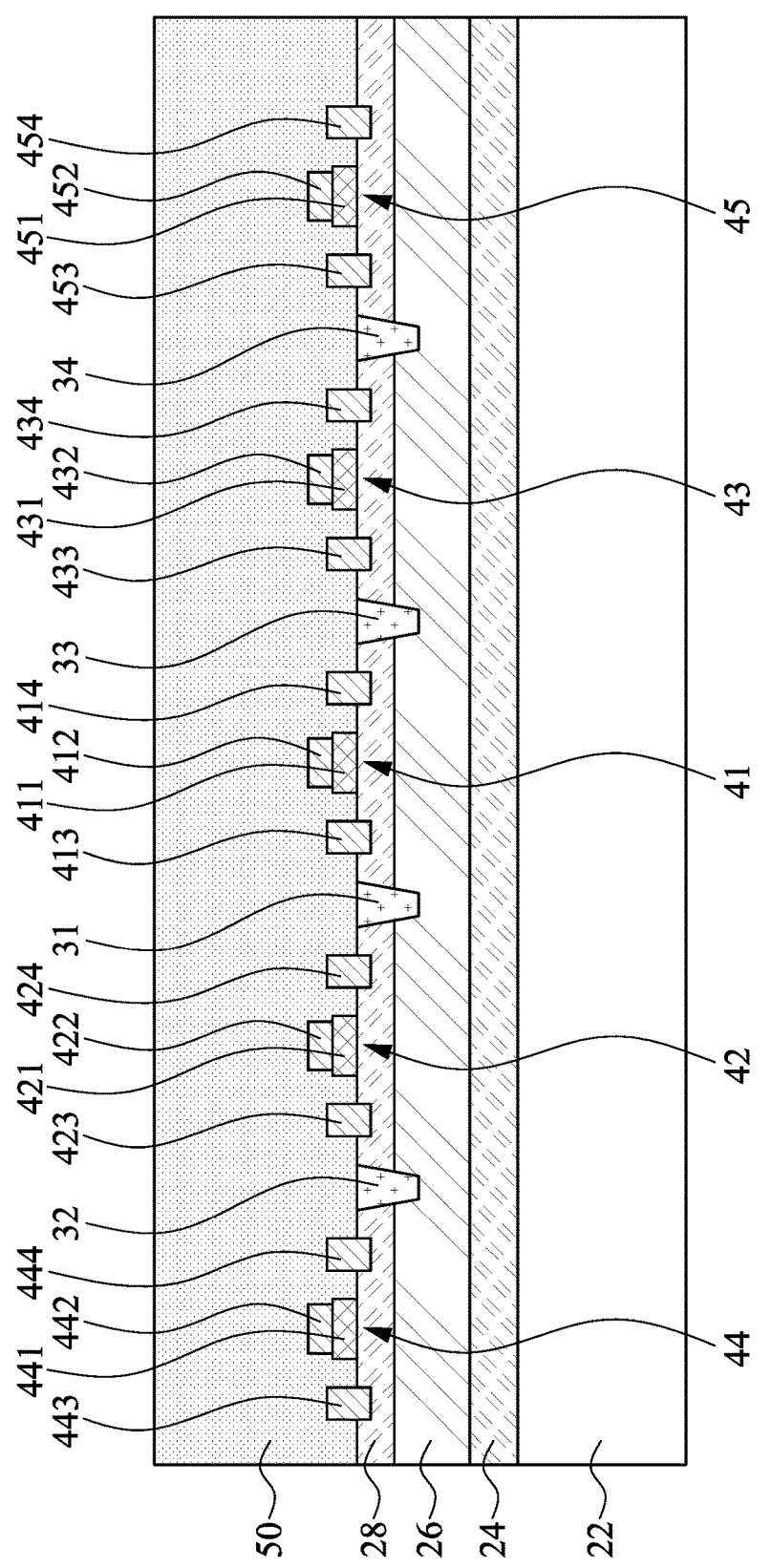
FIG. 2 is a cross-sectional view of a semiconductor device structure in accordance with some embodiments of the present disclosure.

FIG. 2 is a cross-sectional view of a semiconductor device structure in accordance with some embodiments of the present disclosure. The semiconductor device structure 2 may include a substrate 22, a buffer layer 24, a nitride semiconductor layer 26, a nitride semiconductor layer 28, isolation features 31, 32, 33, and 34 as well as a dielectric structure 50.

The substrate 22 may include, without limitation, silicon (Si), doped Si, silicon carbide (SiC), germanium silicide (SiGe), gallium arsenide (GaAs), or other semiconductor materials. The substrate 22 may include, without limitation, sapphire, silicon on insulator (SOI), or other suitable materials.

The buffer layer 24 may be disposed on the substrate 22. The buffer layer 24 may be configured to reduce defect due to the dislocation between the substrate 22 and the nitride semiconductor layer 26. The buffer layer 24 may include, but is not limited to, nitrides, such as AlN, AlGaN or the like, or oxides.

The nitride semiconductor layer 26 may be disposed on the buffer layer 24. The nitride semiconductor layer 26 may include a group III-V layer. The nitride semiconductor layer 26 may include, but is not limited to, a group III nitride, for example, a compound $In_aAl_bGa_{1-a-b}N$, in which a+b≤1. The group III nitride further includes, but is not limited to, for example, a compound $Al_aGa_{(1-a)}N$, in which a≤1. The nitride semiconductor layer 26 may include a gallium nitride (GaN) layer. GaN has a bandgap of about 3.4 eV. The thickness of the nitride semiconductor layer 26 may range, but is not limited to, from about 0.5 μm to about 10 μm.

The nitride semiconductor layer 28 may be disposed on the nitride semiconductor layer 26. The nitride semiconductor layer 28 may include a group III-V layer. The nitride semiconductor layer 28 may include, but is not limited to, a group III nitride, for example, a compound $In_aAl_bGa_{1-a-b}N$, in which a+b≤1. The group III nitride may further include, but is not limited to, for example, a compound $Al_aGa_{(1-a)}N$, in which a≤1. The nitride semiconductor layer 28 may have a greater bandgap than that of the nitride semiconductor layer 26. The nitride semiconductor layer 28 may include an aluminum gallium nitride (AlGaN) layer. AlGaN has a bandgap ranging from about 3.4 eV to about 6.0 eV, which depends on the value of "a". For example, $Al_{0.3}Ga_{0.7}N$ has a bandgap of about 4.0 eV. The thickness of the nitride semiconductor layer 28 may range from, but is not limited to, from about 10 nm to about 100 nm.

A heterojunction is formed between the nitride semiconductor layer 28 and the nitride semiconductor layer 26, and the polarization of the heterojunction forms a two-dimensional electron gas (2DEG) in the nitride semiconductor layer 26. The 2DEG may be formed in the nitride semiconductor layer 26 and adjacent to the nitride semiconductor layer 28.

The semiconductor device structure 2 may include a nitride semiconductor layer 411 (or a depletion layer). The nitride semiconductor layer 411 may be disposed on the nitride semiconductor layer 28. The nitride semiconductor layer 411 may be in contact with the nitride semiconductor layer 28. The nitride semiconductor layer 411 may be doped with impurities. The nitride semiconductor layer 411 may include p-type dopants. The nitride semiconductor layer 411 may include a p-type doped III-V group material, for example, but not limited to p-type doped GaN, p-type doped AlGaN, or p-type doped AlN layer. The p-type dopants may include magnesium (Mg), beryllium (Be), zinc (Zn) or cadmium (Cd). The nitride semiconductor layer 411 may be configured to control the concentration of the 2DEG in the nitride semiconductor layer 26. The nitride semiconductor layer 411 can be used to deplete the 2DEG under the nitride semiconductor layer 411.

The semiconductor device structure 2 may include an electrode 412 (or a gate). The electrode 412 may be a control electrode. The electrode 412 may be disposed on the nitride semiconductor layer 411. The electrode 412 may be in contact with the nitride semiconductor layer 411. The electrode 412 may include a gate structure. The electrode 412 may include a gate conductive structure. The gate conductive structure may include titanium (Ti), tantalum (Ta), tungsten (W), aluminum (Al), cobalt (Co), copper (Cu), nickel (Ni), platinum (Pt), lead (Pb), molybdenum (Mo) or compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials. The electrode 412 and the nitride semiconductor layer 411 may form a Schottky contact. The electrode 412 and the nitride semiconductor layer 411 may form an Ohmic contact.

The semiconductor device structure 2 may include an electrode 413 (or a source electrode or a source structure). The electrode 413 may be a current electrode. The electrode 413 may be disposed on the nitride semiconductor layer 28. The electrode 413 may be in contact with the nitride semiconductor layer 28. The electrode 413 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 413 and the nitride semiconductor layer 28 may form an Ohmic contact.

The semiconductor device structure 2 may include an electrode 414 (or a drain electrode or a drain structure. The electrode 414 may be a current electrode. The electrode 414 may be disposed on the nitride semiconductor layer 28. The electrode 414 may be in contact with the nitride semiconductor layer 28. The electrode 414 may include, for example, without limitation, a conductive material. The electrode 414 and the nitride semiconductor layer 28 may form an Ohmic contact.

The nitride semiconductor layer 26, nitride semiconductor layer 28, nitride semiconductor layer 411, electrode 412, electrode 413, and electrode 414 may define a transistor 41. The transistor 41 may correspond to the device 10 as shown in FIG. 1. The electrode 412 may correspond to the terminal 101 as shown in FIG. 1. The electrode 413 may correspond to the terminal 103 as shown in FIG. 1. The electrode 414 may correspond to the terminal 102 as shown in FIG. 1. The electrode 413 may correspond to the terminal 102 as shown in FIG. 1. The electrode 414 may correspond to the terminal 103 as shown in FIG. 1.

The semiconductor device structure 2 may include a nitride semiconductor layer 421, an electrode 422, an electrode 423, and an electrode 424. The material and the function of the nitride semiconductor layer 421 may be the same as or similar to those of the nitride semiconductor layer 411. The material and the function of the electrode 422 may be the same as or similar to those of the electrode 412. The material and the function of the electrode 423 may be the same as or similar to those of the electrode 413. The material and the function of the electrode 424 may be the same as or similar to those of the electrode 414. The nitride semiconductor layer 26, nitride semiconductor layer 28, nitride semiconductor layer 421, electrode 422, electrode 423, and electrode 424 may define a transistor 42. The transistor 42 may correspond to the transistor 12 as shown in FIG. 1. The electrode 422 may correspond to the terminal 121 as shown in FIG. 1. The electrode 423 may correspond to the terminal 123 as shown in FIG. 1. The electrode 424 may correspond to the terminal 122 as shown in FIG. 1.

The semiconductor device structure 2 may include a nitride semiconductor layer 431, an electrode 432, an electrode 433, and an electrode 434. The material and the function of the nitride semiconductor layer 431 may be the same as or similar to those of the nitride semiconductor layer 411. The material and the function of the electrode 432 may be the same as or similar to those of the electrode 412. The material and the function of the electrode 433 may be the same as or similar to those of the electrode 413. The material and the function of the electrode 434 may be the same as or similar to those of the electrode 414. The nitride semiconductor layer 26, nitride semiconductor layer 28, nitride semiconductor layer 431, electrode 432, electrode 433, and electrode 434 may define a transistor 43. The transistor 43 may correspond to the transistor 13 as shown in FIG. 1. The electrode 432 may correspond to the terminal 131 as shown in FIG. 1. The electrode 433 may correspond to the terminal 132 as shown in FIG. 1. The electrode 424 may correspond to the terminal 133 as shown in FIG. 1.

The semiconductor device structure 2 may include a nitride semiconductor layer 441, an electrode 442, an electrode 443, and an electrode 444. The material and the function of the nitride semiconductor layer 441 may be the same as or similar to those of the nitride semiconductor layer 411. The material and the function of the electrode 442 may be the same as or similar to those of the electrode 412. The material and the function of the electrode 443 may be the same as or similar to those of the electrode 413. The material and the function of the electrode 444 may be the same as or similar to those of the electrode 414. The nitride semiconductor layer 26, nitride semiconductor layer 28, nitride semiconductor layer 441, electrode 442, electrode 443, and electrode 444 may define a transistor 44. The transistor 44 may correspond to the transistor 14 as shown in FIG. 1. The electrode 442 may correspond to the terminal 141 as shown in FIG. 1. The electrode 443 may correspond to the terminal 143 as shown in FIG. 1. The electrode 424 may correspond to the terminal 142 as shown in FIG. 1.

The semiconductor device structure 2 may include a nitride semiconductor layer 451, an electrode 452, an electrode 453, and an electrode 454. The material and the function of the nitride semiconductor layer 451 may be the same as or similar to those of the nitride semiconductor layer 411. The material and the function of the electrode 452 may be the same as or similar to those of the electrode 412. The material and the function of the electrode 453 may be the same as or similar to those of the electrode 413. The material and the function of the electrode 454 may be the same as or similar to those of the electrode 414. The nitride semiconductor layer 26, nitride semiconductor layer 28, nitride semiconductor layer 451, electrode 452, electrode 453, and electrode 454 may define a transistor 45. The transistor 45 may correspond to the transistor 15 as shown in FIG. 1. The electrode 452 may correspond to the terminal 151 as shown in FIG. 1. The electrode 453 may correspond to the terminal 152 as shown in FIG. 1. The electrode 454 may correspond to the terminal 153 as shown in FIG. 1.

The transistors 41, 42, 43, 44, and 45 may be disposed on a single substrate 22. The transistors 42, 43, 44, and 45 may define a clamping device, such as the device 11 as shown in FIG. 1. The transistors 42, 43, 44, and 45 may be configured to fix a potential difference between the electrode 412 and electrode 413. The transistors 42, 43, 44, and 45 may be configured to fix a potential difference between the electrode 412 and electrode 414.

The isolation feature 31 may be configured to separate or electrically isolate the transistor 41 and the transistor 42. The isolation feature 31 may include a shallow trench isolation (STI). The isolation feature 32 may be configured to separate or electrically isolate the transistor 42 and the transistor 44. The isolation feature 32 may include an STI. The isolation feature 33 may be configured to separate or electrically isolate the transistor 41 and the transistor 43. The isolation feature 33 may include an STI. The isolation feature 34 may be configured to separate or electrically isolate the transistor 43 and the transistor 45. The isolation feature 34 may include an STI.

The dielectric structure 50 may be disposed on the nitride semiconductor layer 28. The dielectric structure 50 may include one or more dielectric materials. The dielectric structure 50 may include a multi-layered structure. The dielectric structure 50 may include silicon oxide, silicon nitride, silicon oxynitirde, or other suitable materials.

Figure 3:
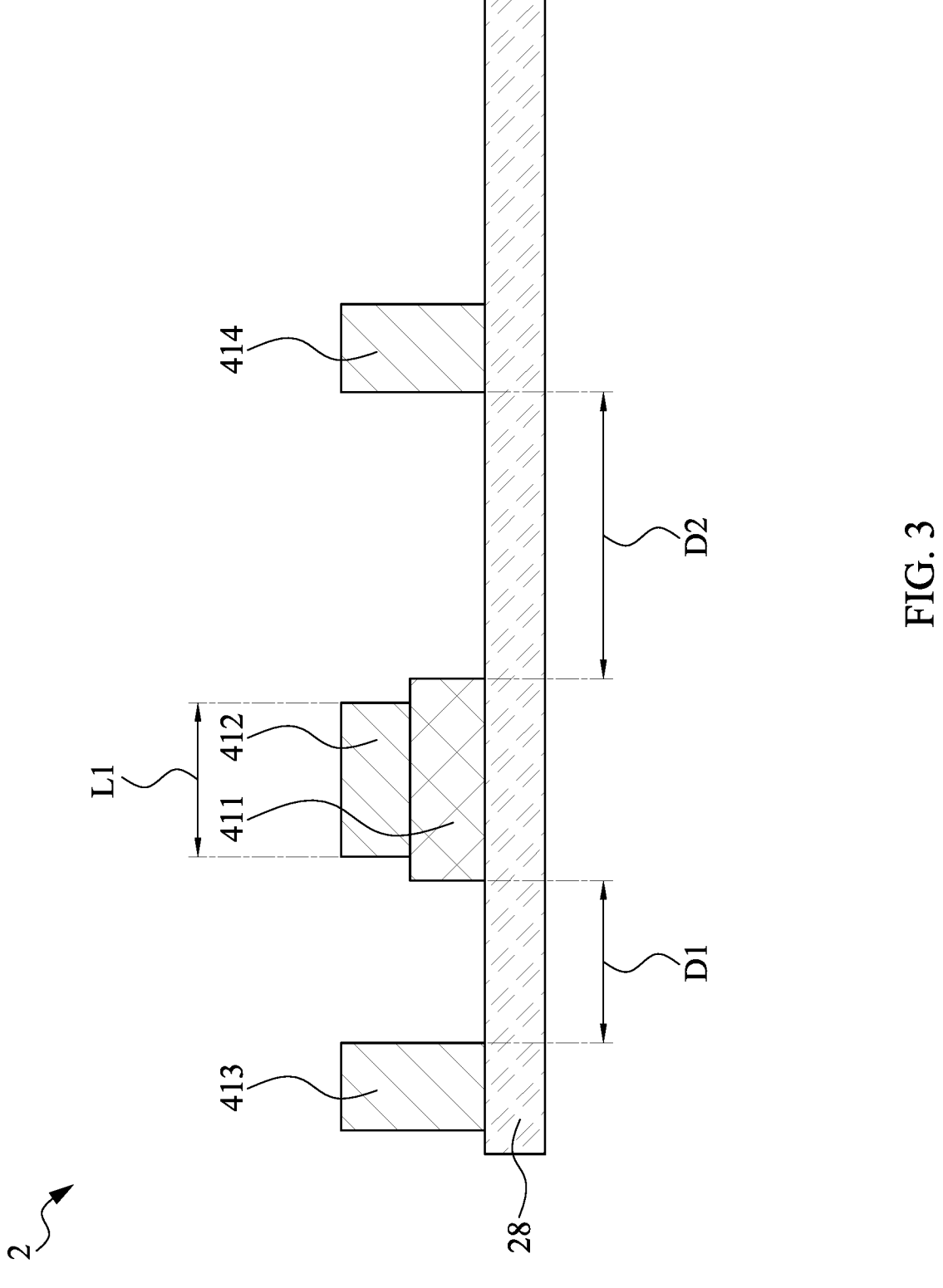
FIG. 3 is a cross-sectional view of a semiconductor device structure in accordance with some embodiments of the present disclosure.

FIG. 3 is a cross-sectional view of the semiconductor device structure 2 in accordance with some embodiments of the present disclosure. Reference is made to a direction connecting the electrode 413 and the electrode 414. The electrode 412 may have a length L1. The nitride semiconductor layer 411 and electrode 413 may have a distance D1 therebetween. The nitride semiconductor layer 411 and electrode 414 may have a distance D2 therebetween.

Figure 4:
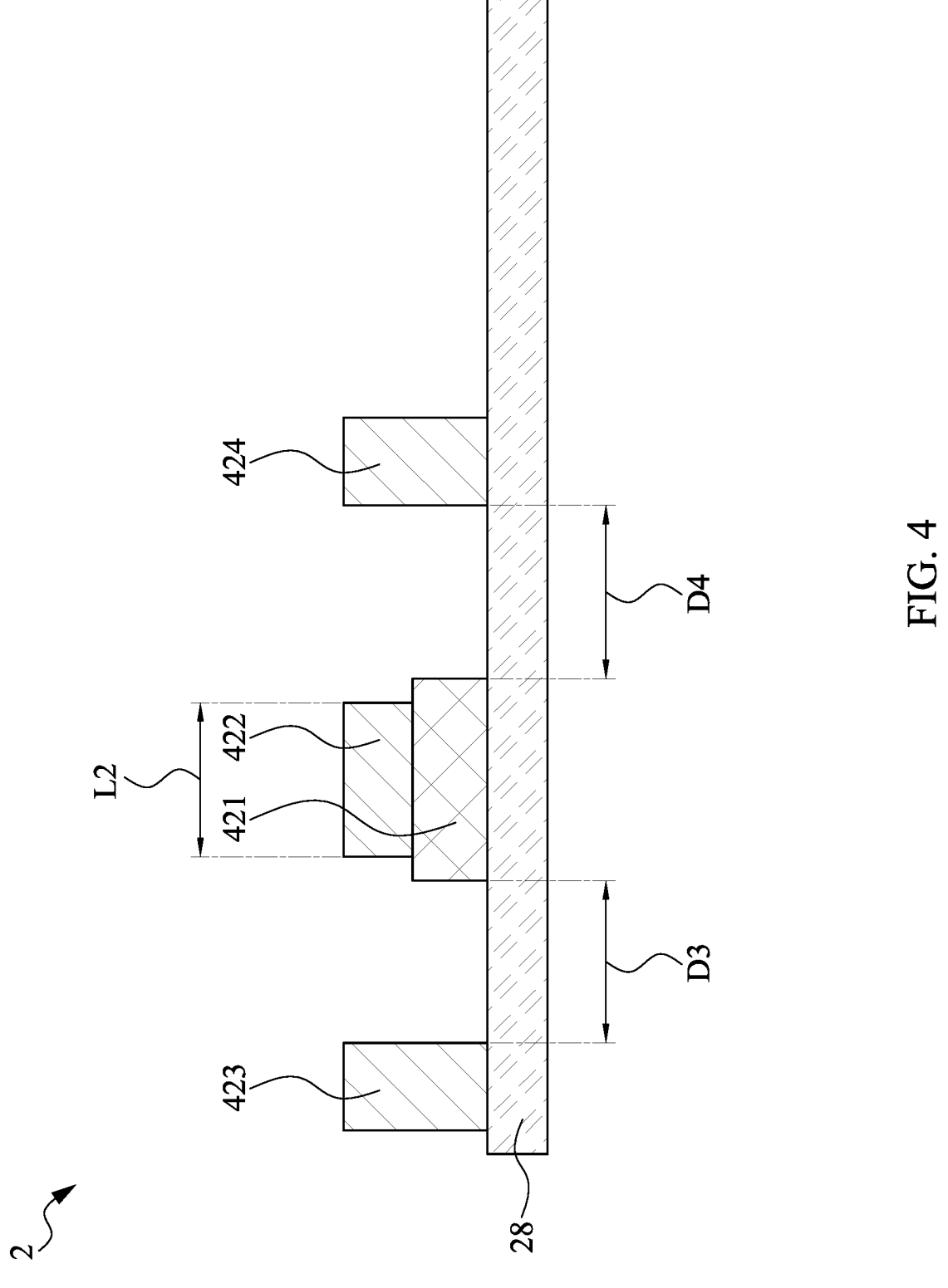
FIG. 4 is a cross-sectional view of a semiconductor device structure in accordance with some embodiments of the present disclosure.

FIG. 4 is a cross-sectional view of the semiconductor device structure 2 in accordance with some embodiments of the present disclosure. Reference is made to a direction connecting the electrode 423 and the electrode 424. The electrode 422 may have a length L2. The nitride semiconductor layer 421 and electrode 423 may have a distance D3 therebetween. The nitride semiconductor layer 421 and electrode 424 may have a distance D4 therebetween.

Figure 5:
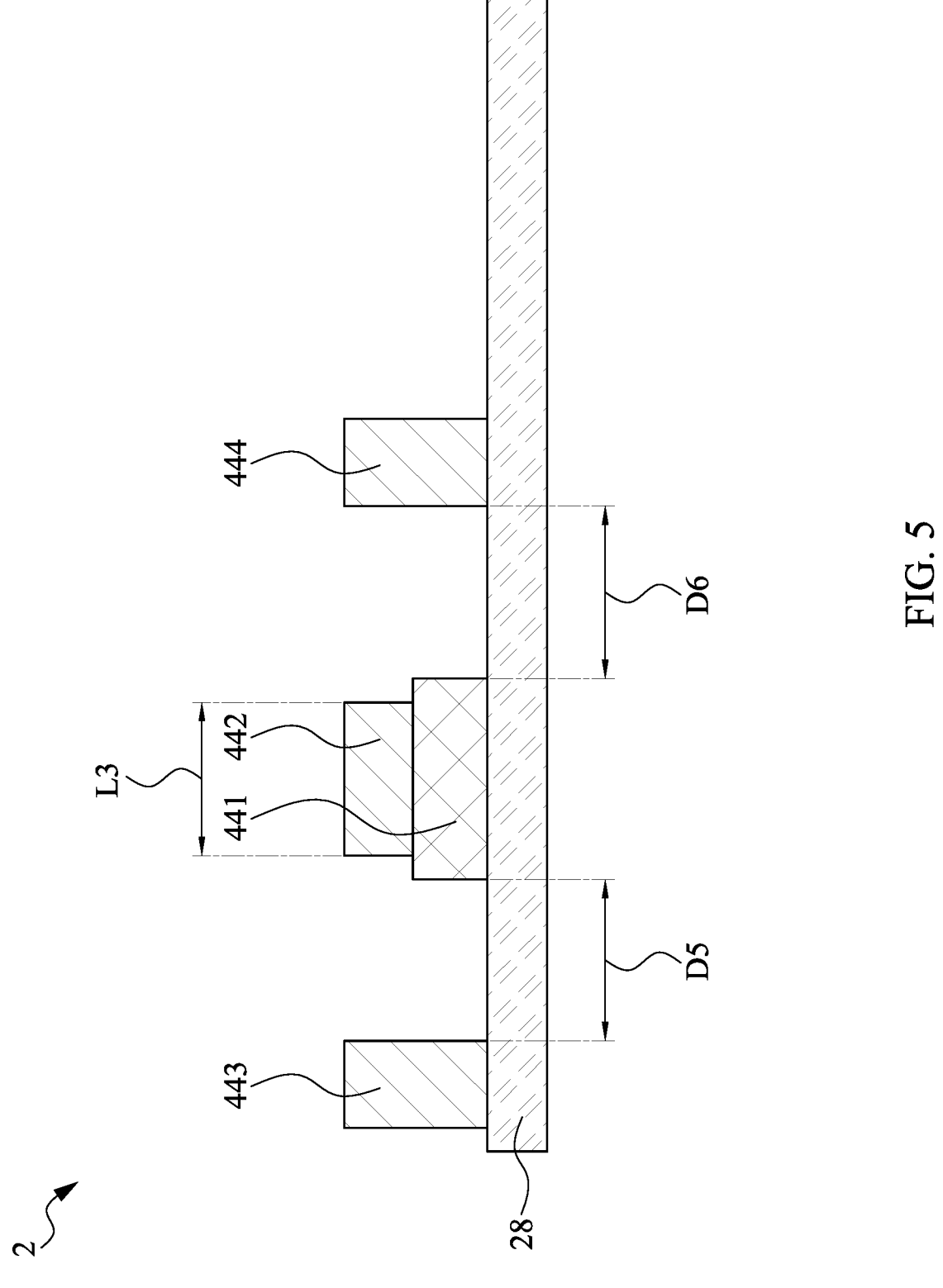
FIG. 5 is a cross-sectional view of a semiconductor device structure in accordance with some embodiments of the present disclosure.

FIG. 5 is a cross-sectional view of the semiconductor device structure 2 in accordance with some embodiments of the present disclosure. Reference is made to a direction connecting the electrode 443 and the electrode 444. The electrode 442 may have a length L3. The nitride semiconductor layer 441 and electrode 443 may have a distance D5 therebetween. The nitride semiconductor layer 441 and electrode 444 may have a distance D6 therebetween.

The length L1 of the electrode 412 may be different from the length L2 of the electrode 422. The length L1 of the electrode 412 may be greater than the length L2 of the electrode 422. The length L2 of the electrode 422 may be substantially the same as the length L3 of the electrode 442. The distance D1 may be different from the distance D2. The distance D1 may be less than the distance D2. The distance D3 may be substantially the same as the distance D4. The distance D1 may be substantially the same as the distance D3. The distance D5 may be substantially the same as the distance D6. The distance D1 may be substantially the same as the distance D5. In some conditions, the working device may be applicable to a high voltage device, and the distance between the gate and drain may be different from that between the gate and source. Each of the transistors of the clamping device may have substantially the same dimensions.

Figure 6:
FIG. 6 is a layout of the semiconductor device structure as shown in FIG. 2 in accordance with some embodiments of the present disclosure.

FIG. 6 is a layout of the semiconductor device structure 2 in accordance with some embodiments of the present disclosure. The semiconductor device structure 2 may include conductive features 61, 62, 63, 64, and 65. Each of the conductive features 61, 62, 63, 64, and 65 may include one or more conductive layers. Each of the conductive features 61, 62, 63, 64, and 65 may include one or more conductive vias. Each of the conductive features 61, 62, 63, 64, and 65 may include a multi-layered structure. Each of the conductive features 61, 62, 63, 64, and 65 may include a copper (Cu), titanium (Ti), tantalum (Ta), tungsten (W), aluminum (Al), cobalt (Co), nickel (Ni), platinum (Pt), lead (Pb), molybdenum (Mo) or compounds thereof.

The conductive feature 61 may be electrically connected to the electrode 412. The conductive feature 61 may be electrically connected to the electrode 442. The conductive feature 61 may be electrically connected to the electrode 452. The conductive feature 61 may be electrically connected to the electrode 423. The conductive feature 61 may be electrically connected to the electrode 433.

The conductive feature 62 may be electrically connected to the electrode 422. The conductive feature 62 may be electrically connected to the electrode 443.

The conductive feature 63 may be electrically connected to the electrode 432. The conductive feature 63 may be electrically connected to the electrode 453.

The conductive feature 64 may be electrically connected to the electrode 413. The conductive feature 64 may be electrically connected to the electrode 424. The conductive feature 64 may be electrically connected to the electrode 454.

The conductive feature 65 may be electrically connected to the electrode 414. The conductive feature 65 may be electrically connected to the electrode 434. The conductive feature 65 may be electrically connected to the electrode 444.

Figure 7:
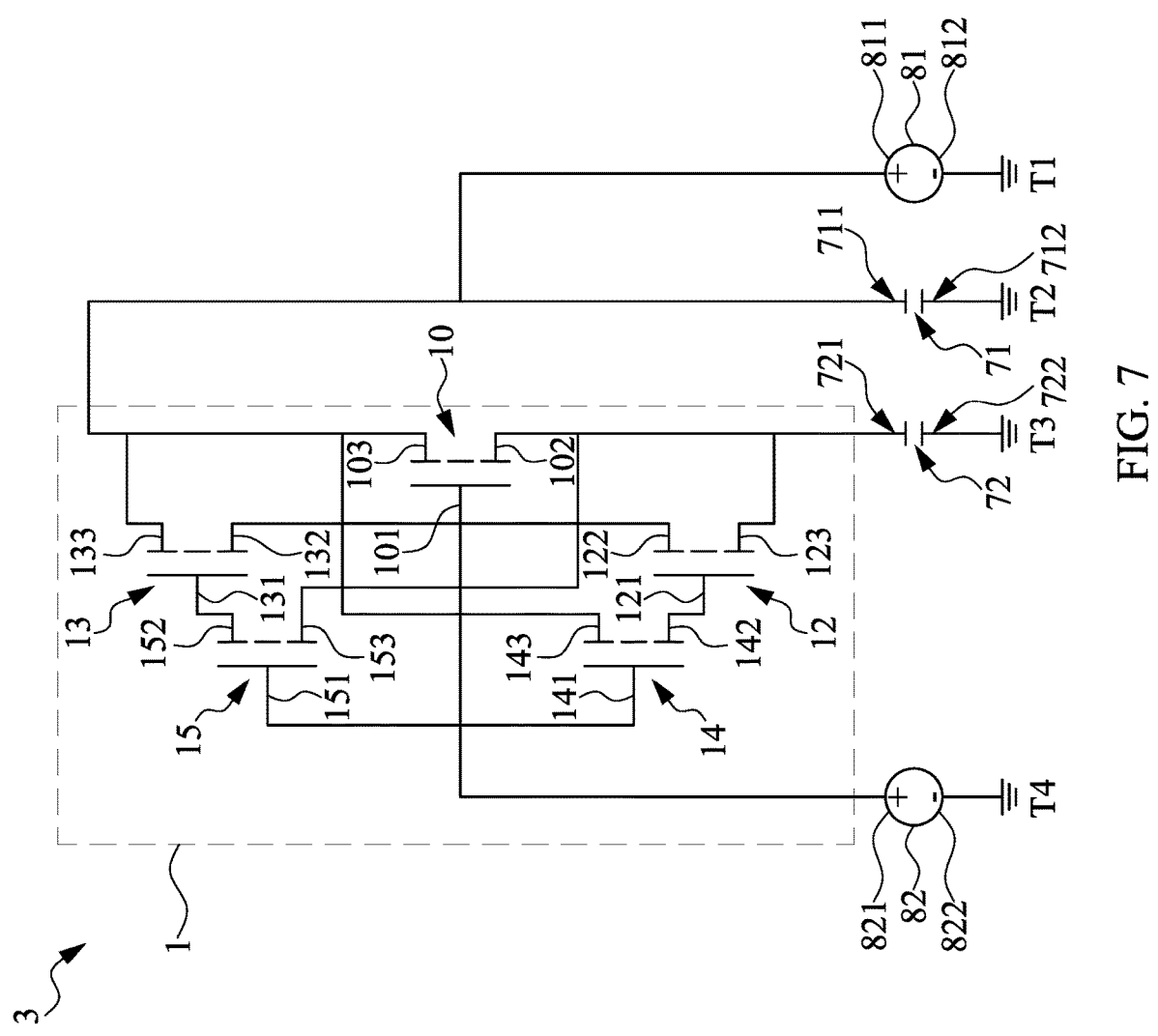
FIG. 7 is a schematic view of a circuit, in accordance with some embodiments of the present disclosure.

FIG. 7 is a schematic view of a circuit 3, in accordance with some embodiments of the present disclosure.

The circuit 3 may include the device 10, the device 11, a device 71, a device 72, a power source 81, and a power source 82.

The device 71 may include a passive device. The device 71 may include a capacitor. The device 71 may include a terminal 711 and a terminal 712. The terminal 711 may be electrically connected to the device 10. The terminal 711 may be electrically connected to the terminal 103 of the device 10. The terminal 711 may be electrically connected to the transistor 13. The terminal 711 may be electrically connected to the terminal 133 of the transistor 13. The terminal 711 may be electrically connected to the transistor 14. The terminal 711 may be electrically connected to the terminal 143 of the transistor 14. The terminal 712 may be electrically connected to a terminal T2. The terminal T2 may include ground.

The device 72 may include a passive device. The device 72 may include a capacitor. The device 72 may include a terminal 721 and a terminal 722. The terminal 721 may be electrically connected to the device 10. The terminal 721 may be electrically connected to the terminal 102 of the device 10. The terminal 721 may be electrically connected to the transistor 12. The terminal 721 may be electrically connected to the terminal 123 of the transistor 12. The terminal 721 may be electrically connected to the transistor 15. The terminal 721 may be electrically connected to the terminal 153 of the transistor 15. The terminal 722 may be electrically connected to a terminal T3. The terminal T3 may include ground.

The power source 81 may include a terminal 811 and a terminal 812. The terminal 811 may be electrically connected to the device 10. The terminal 811 may be electrically connected to the terminal 103 of the device 10. The terminal 811 may be electrically connected to the terminal 133 of the transistor 13. The terminal 811 may be electrically connected to the terminal 143 of the transistor 14. The terminal 812 may be electrically connected to a terminal T1. The terminal T1 may include ground.

The power source 82 may include a terminal 821 and a terminal 822. The terminal 821 may be electrically connected to the device 10. The terminal 821 may be electrically connected to the terminal 101 of the device 10. The terminal 821 may be electrically connected to the terminal 122 of the device 12. The terminal 821 may be electrically connected to the terminal 132 of the device 13. The terminal 821 may be electrically connected to the terminal 141 of the device 14. The terminal 821 may be electrically connected to the terminal 151 of the device 15. The terminal 822 may be electrically connected to a terminal T4. The terminal T4 may include ground.

Figure 8A:
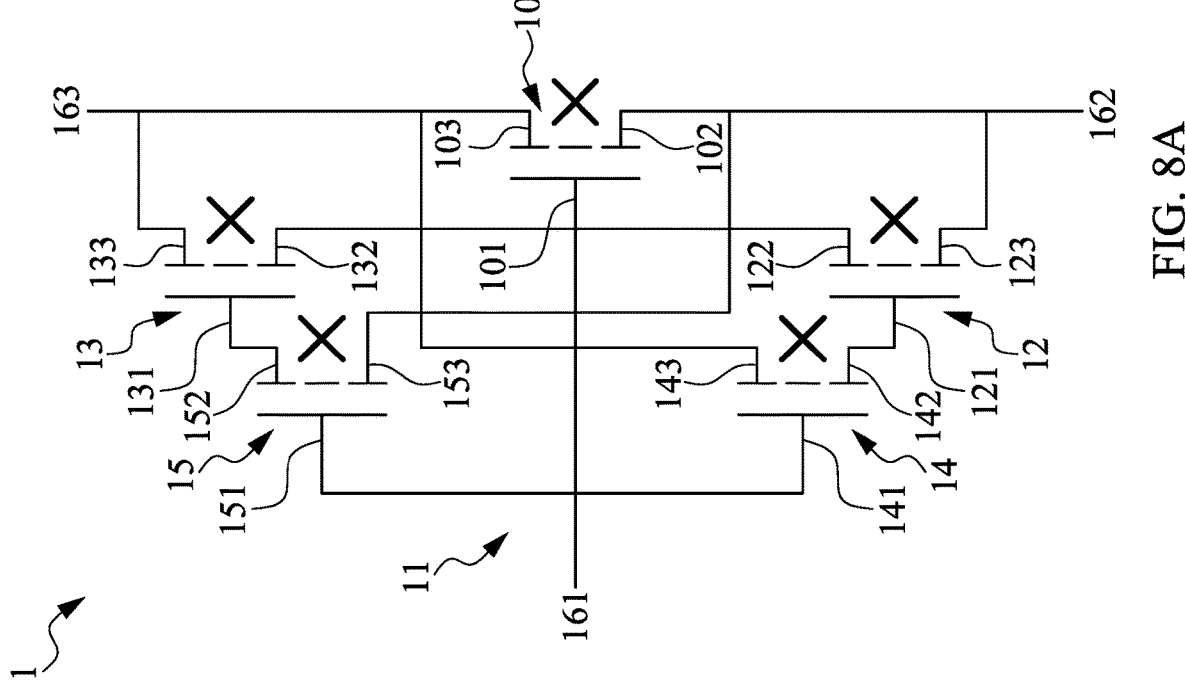
FIG. 8A illustrates a power path of a circuit, in accordance with some embodiments of the present disclosure.
Figure 8B:
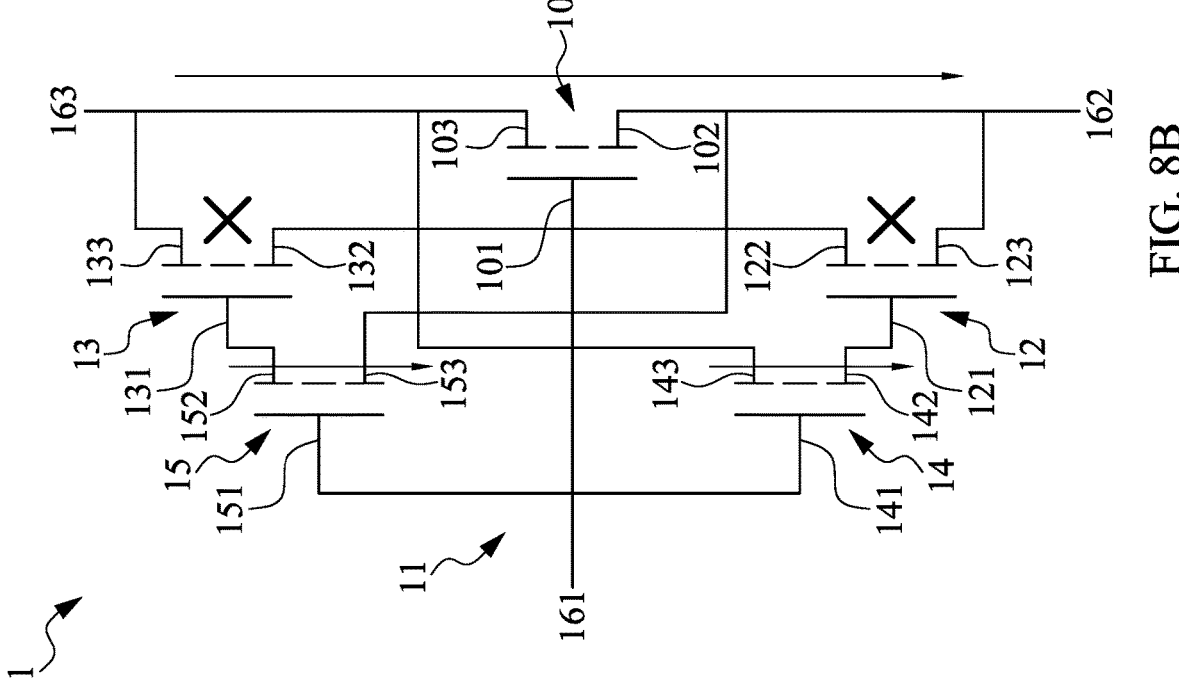
FIG. 8B illustrates a power path of a circuit, in accordance with some embodiments of the present disclosure.
Figure 8C:
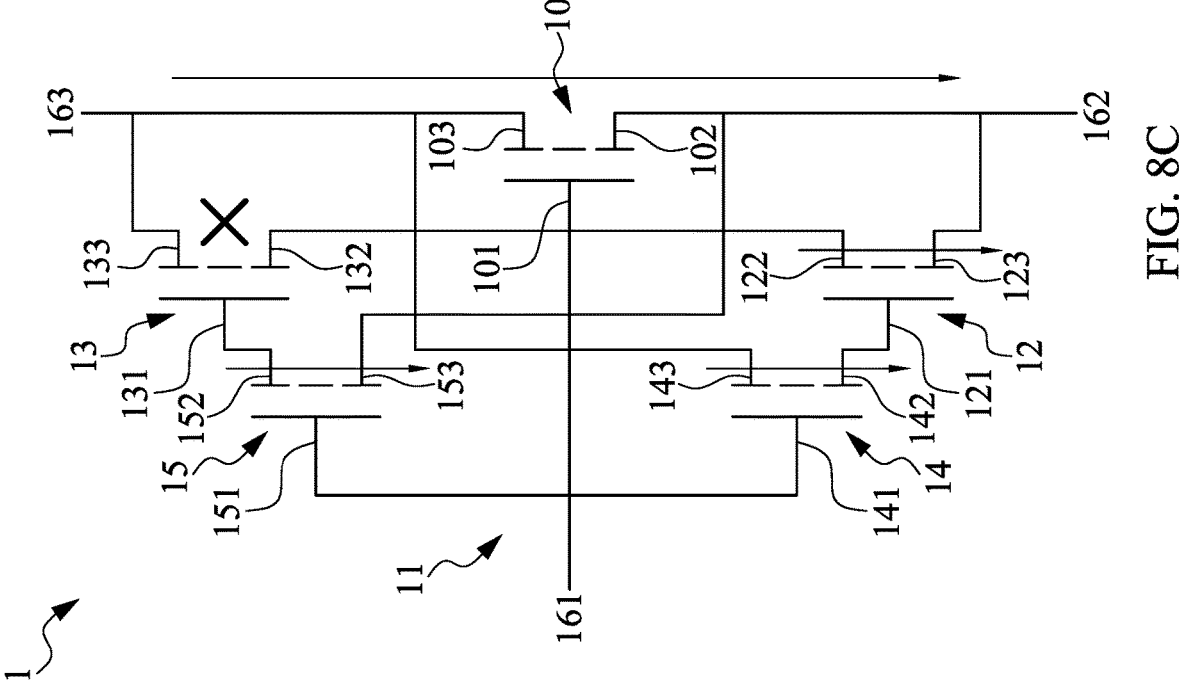
FIG. 8C illustrates a power path of a circuit, in accordance with some embodiments of the present disclosure.
Figure 9A:
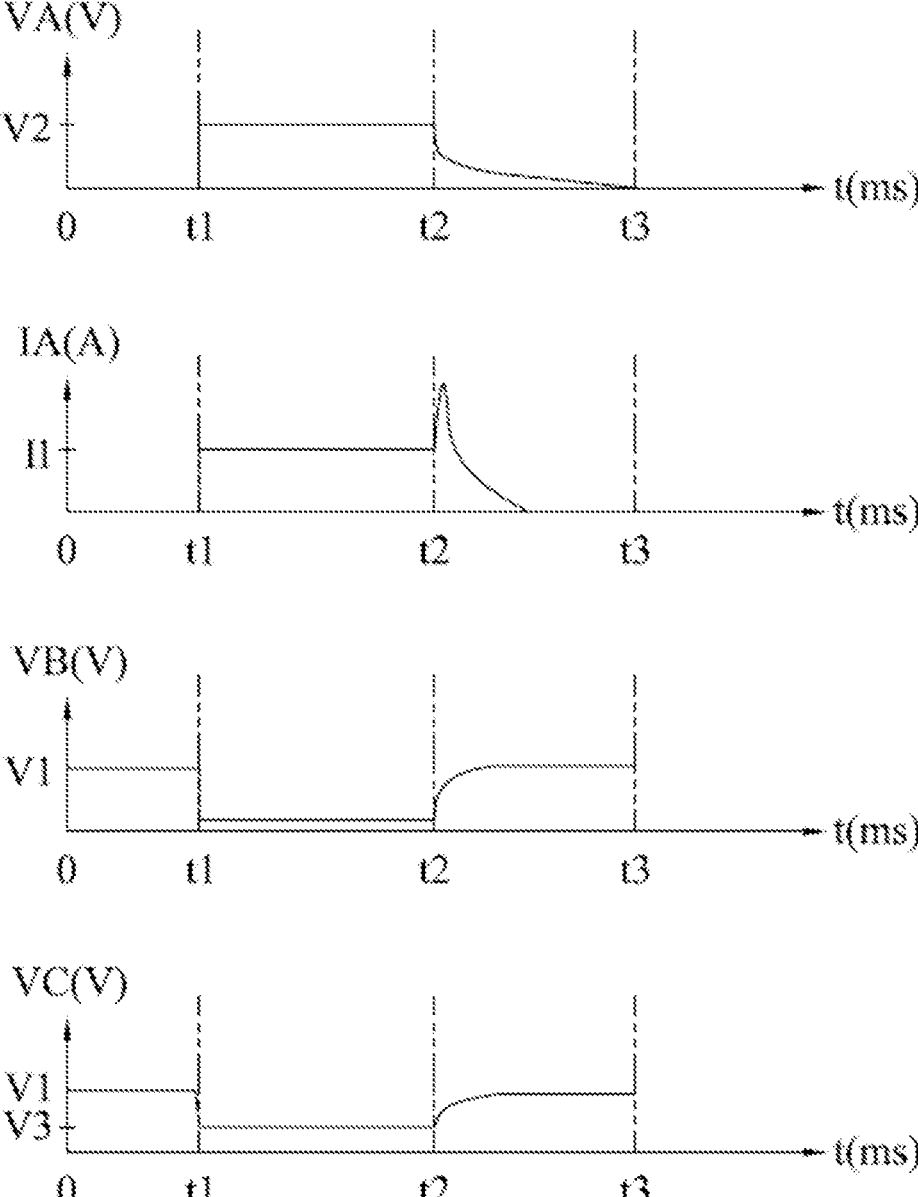
FIG. 9A is a time diagram of signals in a circuit, in accordance with some embodiments of the present disclosure.
Figure 9B:
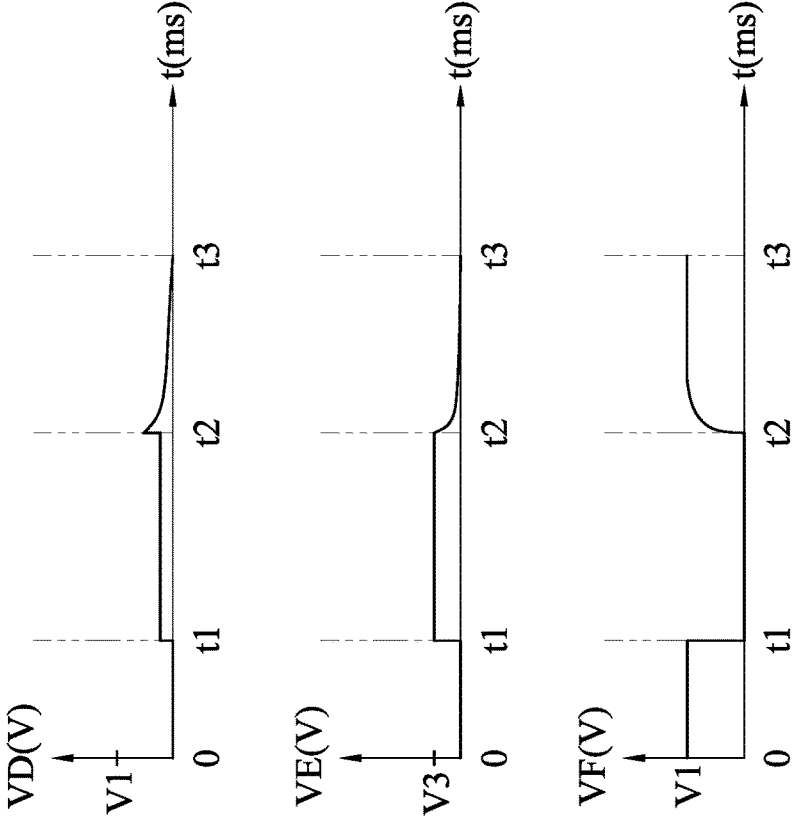
FIG. 9B is a time diagram of signals in a circuit, in accordance with some embodiments of the present disclosure.

Referring to FIG. 8A, FIG. 8B, FIG. 8C, FIG. 9A, and FIG. 9B, FIG. 8A, FIG. 8B, and FIG. 8C are schematic view of the circuit 1 and signal paths therein, in accordance with some embodiments of the present disclosure. FIG. 9A and FIG. 9B are time diagrams of signals of the circuit 1, in accordance with some embodiments of the present disclosure.

The terminal 161 shown in FIG. 8A, 8B, and FIG. 8C may be electrically connected to the power source 82 shown in FIG. 7. The terminal 162 shown in FIG. 8A, 8B, and FIG. 8C may be electrically connected to the device 72 shown in FIG. 7. The terminal 163 shown in FIG. 8A, 8B, and FIG. 8C may be electrically connected to the power source 81 shown in FIG. 7. The terminal 163 shown in FIG. 8A, 8B, and FIG. 8C may be electrically connected to the device 71 shown in FIG. 7.

The voltage VA shown in FIG. 9A may indicate a voltage imposed on the terminal 101. The current IA shown in FIG. 9A may indicate a current flowing from the terminal 103 to terminal 102. The voltage VB shown in FIG. 9A may indicate a potential difference between the terminal 102 and terminal 103. The voltage VC shown in FIG. 9A may indicate a potential difference between the terminal 132 and terminal 133. The voltage VD shown in FIG. 9B may indicate a potential difference between the terminal 121 and terminal 123. The voltage VE shown in FIG. 9B may indicate a potential difference between the terminal 122 and terminal 123. The voltage VF shown in FIG. 9B may indicate a potential difference between the terminal 121 and terminal 103. Voltage V2 shown in FIG. 9A and FIG. 9B may indicate a voltage supplied by the power source 82. Voltage V1 shown in FIG. 9A and FIG. 9B may indicate a voltage provided by the power source 81. Current I1 shown in FIG. 9A and FIG. 9B may indicate a current provided by the power source 81. Voltage V3 may indicate a voltage difference between the voltage V1 and voltage V2. The voltage V2 may be greater than the voltage V1. The voltage V1 may be greater than the voltage V3.

The signal path shown in FIG. 8A may correspond to the time interval between time t0 and time t1 of FIG. 9A and FIG. 9B. When the voltage VA is less than the breakdown voltage of the circuit 1, the device 10 may be in off condition. The transistor 12 may be in off condition. The transistor 13 may be in off condition. The transistor 14 may be in off condition. The transistor 15 may be in off condition.

The signal path shown in FIG. 8B may correspond to the time interval between time t1 and time t2 of FIG. 9A and FIG. 9B. When the voltage VA is greater than the breakdown voltage of circuit 1, the device 10 may be in on condition. The transistor 12 may be in off condition. The transistor 13 may be in off condition. The transistor 14 may be in on condition. The transistor 15 may be in on condition. The current IA may flow from the terminal 103 to the terminal 102.

The signal path shown in FIG. 8C may correspond to the time interval between time t2 and time t3 of FIG. 9A and FIG. 9B. In the time interval between time t2 and time t3, the device 71 may be short-circuited. The voltage VA may decrease as time passes. The current IA may increases initially and then decrease as time passes. The voltage VB may approximate to voltage V1 as time passes. The voltage VC may approximate to voltage V1 as time passes. The voltage VD may decrease as time passes. The voltage VE may decrease as time passes. The voltage VF may approximate to voltage V1 as time passes. The device 10 may be in on condition. The transistor 12 may be in off condition. The transistor 13 may be in on condition. The transistor 14 may be in on condition. The transistor 15 may be in on condition.

When the device 10 is short-circuited, the device 12 may be configured to clamp the voltage between the terminals 101 and 102 (or between terminals 101 and 103) promptly, which thereby prevents the punch-through of the terminal 101 of the device 10. When the device 10 is short-circuited, the device 13 may be configured to clamp the voltage between the terminals 101 and 102 (or between terminals 101 and 103) promptly, which thereby prevents the punch-through of the terminal 101 of the device 10. The device 14 may be configured to be in off condition when the device 10 is in off condition, which thereby prevent from punch-through of the terminal 121 of the device 12 (or the terminal 131 of the device 13). The device 15 may be configured to be in off condition when the device 10 is in off condition, which thereby prevent from punch-through of the terminal 121 of the device 12 (or the terminal 131 of the device 13). Such arrangement may promptly protect the working device.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
a substrate;
a first nitride semiconductor layer disposed on the substrate;
a second nitride semiconductor layer disposed on the first nitride semiconductor layer;
a first transistor disposed on the second nitride semiconductor layer, wherein the first transistor comprises a first control electrode, a first current electrode and a second current electrode;
a clamping device disposed on the second nitride semiconductor layer and electrically coupled with the first transistor, wherein the clamping device comprises a second transistor and a third transistor electrically coupled with the second transistor, and the clamping device is electrically coupled with the first current electrode and the second current electrode of the first transistor; and
a third nitride semiconductor layer doped with impurities and disposed between the first control electrode and the second nitride semiconductor layer.

2. The semiconductor device structure of claim 1, wherein
the second transistor comprises a second control electrode and a third current electrode,
the third transistor comprises a third control electrode and a fourth current electrode, and
a first potential midpoint is electrically coupled with the first control electrode, the third current electrode, and the fourth current electrode.

3. The semiconductor device structure of claim 2, wherein a first dimension of the first control electrode is different from a second dimension of the second control electrode.

4. The semiconductor device structure of claim 2, wherein the first dimension of the first control electrode is greater than the second dimension of the second control electrode.

5. The semiconductor device structure of claim 2, wherein a first distance between the first control electrode and the first current electrode of the first transistor is different from a second distance between the second control electrode and the third current electrode of the second transistor.

6. The semiconductor device structure of claim 5, wherein the first distance between the first control electrode and the first current electrode of the first transistor is greater than the second distance between the second control electrode and the third current electrode.

7. The semiconductor device structure of claim 2, wherein the clamping device further comprises a fourth transistor and a fifth transistor,
the fourth transistor comprises a fourth control electrode,
the fifth transistor comprises a fifth control electrode, and
the first potential midpoint is electrically coupled with the fourth control electrode and the fifth control electrode.

8. The semiconductor device structure of claim 7, wherein
the fourth transistor comprises a seventh current electrode, and
a second potential midpoint is electrically coupled with the seventh current electrode of the fourth transistor and the second current electrode of the first transistor.

9. The semiconductor device structure of claim 7, wherein the fourth transistor comprises an eighth current electrode electrically coupled with the second control electrode of the second transistor.

10. The semiconductor device structure of claim 7, wherein
the fifth transistor comprises a ninth current electrode, and
a third potential midpoint is electrically coupled with the nine current electrode of the fifth transistor and the first current electrode of the first transistor.

11. The semiconductor device structure of claim 7, wherein the fifth transistor comprises a tenth current electrode electrically coupled with the third control electrode of the third transistor.

12. The semiconductor device structure of claim 7, wherein the first dimension of the first control electrode is different from a third dimension of the fourth control electrode.

13. The semiconductor device structure of claim 7, wherein the first dimension of the first control electrode is greater than the third dimension of the fourth control electrode.

14. The semiconductor device structure of claim 1, further comprising:
a capacitor electrically connected to the second current electrode.

15. A method of manufacturing a semiconductor device structure, comprising:
providing a substrate;
forming a first nitride semiconductor layer on the substrate;
forming a second nitride semiconductor layer on the first nitride semiconductor layer;
forming a first transistor on the second nitride semiconductor layer, wherein the first transistor comprises a first control electrode, a first current electrode and a second current electrode;
forming a clamping device on the second nitride semiconductor layer, wherein the clamping device comprises a second transistor and a third transistor electrically coupled with the second transistor, and the clamping device is electrically coupled with the first current electrode and the second current electrode of the first transistor; and
forming a third nitride semiconductor layer doped with impurities, wherein the third nitride semiconductor layer is located between the first control electrode and the second nitride semiconductor layer.

16. The method of claim 15, further comprising:
forming a capacitor electrically connected to the first transistor.

17. The method of claim 15, wherein
the second transistor comprises a second control electrode and a third current electrode, the third transistor comprises a third control electrode and a fourth current electrode, and a first potential midpoint is electrically coupled with the first control electrode, the third current electrode, and the fourth electrode.

18. The method of claim 15, wherein a first dimension of the first control electrode is different from a second dimension of the second control electrode.

19. A semiconductor device structure, comprising:

a substrate;

a first nitride semiconductor layer disposed on the substrate;

a second nitride semiconductor layer disposed on the first nitride semiconductor layer;

a first transistor disposed on the second nitride semiconductor layer, wherein the first transistor comprises a first control electrode, a first current electrode and a second current electrode; and a clamping device disposed on the second nitride semiconductor layer, wherein the clamping device comprises a second transistor and a third transistor, the second transistor comprises a second control electrode, a third current electrode, and fourth current electrode, the third transistor comprises a third control electrode and a fifth current electrode, and wherein the third current electrode of the second transistor is coupled with the third control electrode of the third transistor, a first potential midpoint is connected to the fifth current electrode of the third transistor and the first current electrode of the first transistor, and a second potential midpoint is connected to the fourth current electrode of the second transistor and the second current electrode of the first transistor.

20. The semiconductor device structure of claim 19, wherein a third potential midpoint is connected to the first control electrode of the first transistor and the second control electrode of the second transistor.

21. The semiconductor device structure of claim 19, wherein a first dimension of the first control electrode is different from a second dimension of the second control electrode.

22. The semiconductor device structure of claim 19, further comprising:

a third nitride semiconductor layer doped with impurities and disposed between the first control electrode and the second nitride semiconductor layer.

23. The semiconductor device structure of claim 19, further comprising:

a capacitor electrically connected to the first transistor.

\* \* \* \* \*